United States Patent [19]

Nagasawa et al.

[11] 4,018,184
[45] Apr. 19, 1977

[54] APPARATUS FOR TREATMENT OF SEMICONDUCTOR WAFER

[75] Inventors: Koichi Nagasawa, Amagasaki; Koichi Kijima, Itami, both of Japan

[73] Assignee: Mitsubishi Denki Kabushiki Kaisha, Tokyo, Japan

[22] Filed: July 28, 1975

[21] Appl. No.: 599,471

[52] U.S. Cl. .................... 118/49.1; 118/4
[51] Int. Cl.² ............................ C23C 13/12
[58] Field of Search ............ 118/48–49.5, 118/500

[56] References Cited

UNITED STATES PATENTS

| | | | |
|---|---|---|---|
| 1,601,931 | 10/1926 | VanArkel | 118/49 UX |
| 2,792,438 | 5/1957 | Dunn | 118/48 X |
| 2,873,222 | 2/1959 | Derick et al. | 118/49 UX |
| 3,293,074 | 12/1966 | Nickl | 118/49.5 |
| 3,330,251 | 7/1967 | Gutsche | 118/49.5 |
| 3,554,162 | 1/1971 | Cota et al. | 118/48 |
| 3,657,006 | 4/1972 | Fisher et al. | 118/48 X |
| 3,658,032 | 4/1972 | Kohler et al. | 118/48 |
| 3,659,552 | 5/1972 | Briody | 118/49.5 |
| 3,705,567 | 12/1972 | Emels | 118/49 |
| 3,918,396 | 11/1975 | Dietze et al. | 118/49.1 |

OTHER PUBLICATIONS

*IBM Technical Disclosure Bulletin,* "Waterinjection System for Thermal Oxidation of Semiconductors," Kemnitz, et al., vol. 17, No. 9, (Feb. 1975), p. 2664.

*Primary Examiner*—Mervin Stein
*Attorney, Agent, or Firm*—Oblon, Fisher, Spivak, McClelland & Maier

[57] ABSTRACT

An apparatus for treatment of a semiconductor wafer comprises a sealable treating vessel which forms a sealed treating chamber in the vessel when sealed. A gas feeder feeds a compressed gas to the treating chamber. A heating device is disposed out of the treating chamber. The semiconductor wafer in the treating chamber is treated with the compressed gas while it is heated by the heating device.

1 Claim, 1 Drawing Figure

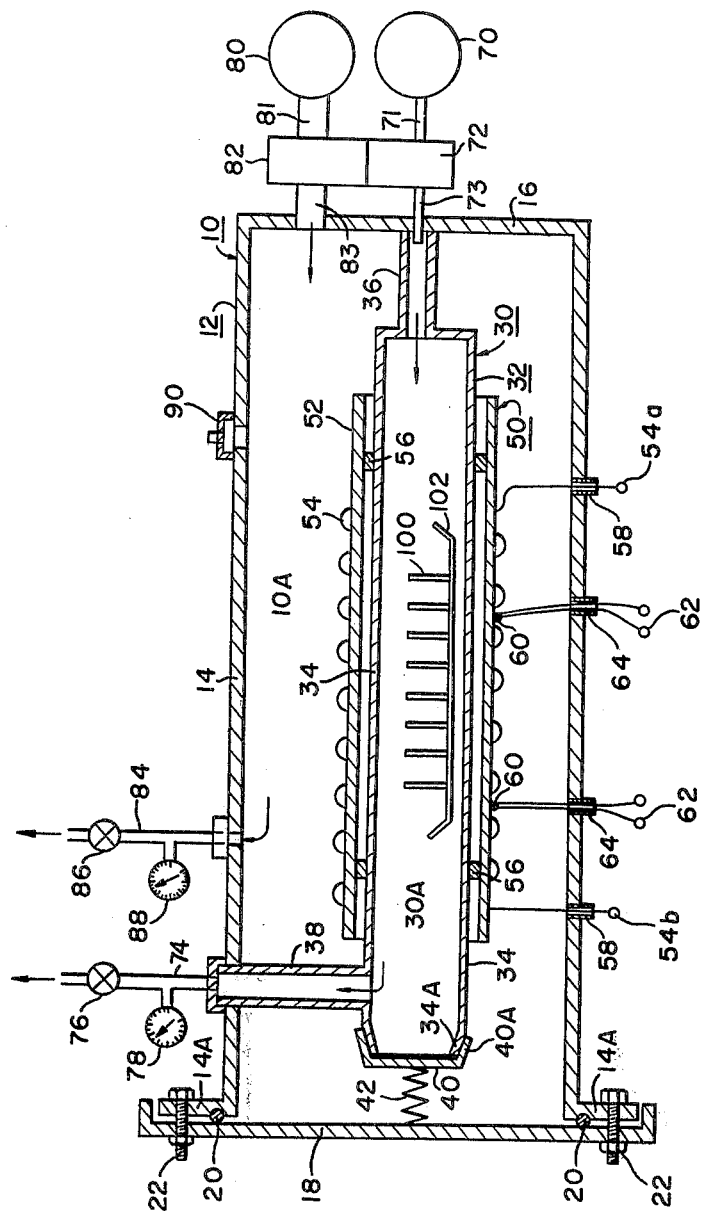

APPARATUS FOR TREATMENT OF SEMICONDUCTOR WAFER

BACKGROUND OF THE INVENTION

1. Field of the Invention

The present invention relates to apparatus for the treatment of a semiconductor wafer. More particularly, the present invention relates to apparatus for effectively forming an oxide membrane on a semiconductor wafer.

2. Description of the Prior Art

Semiconductor devices such as transistors and integrated circuits have been prepared by various treatments for the semiconductor wafers. The treatments include a treatment for forming a silicon oxide membrane on the surface of the semiconductor wafer, such as a silicon wafer, by heat oxidation, and also include a gaseous diffusion method for diffusing an impurity into the semiconductor wafer by contacting it with a gas containing the impurity under the condition of heating the semiconductor wafer. The heat oxidation treatment of the silicon wafers is usually conducted by heating the silicon wafers at about 1000° C under the condition disposing the silicon wafers in an oxidizing gas.

An undesirably long time is necessary in order to form the silicon oxide membrane on the surface of the silicon wafer by the heat oxidation treatment. For example, it usually takes about 10 hours to form a silicon oxide membrane having a thickness of $1 - 2\ \mu m$.

In the gaseous diffusion treatment, it also takes an undesirably long time for the heat treatment in order to provide a high concentration of the diffused impurity. Thus, the undesirably long heat treatment causes the spreading of various diffused regions formed in the wafer to an undesirable extent whereby the electrical characteristics of the semiconductor device are detrimentally effected.

An apparatus for the heat-treatment of a silicon wafer in an oxidizing gas compressed at about 10 atm. has been proposed for shortening the treatment time in the heat oxidizing process. When this apparatus is used, the formation of a silicon oxide membrane is promoted, for example, in order to shorten the time for forming the silicon oxide membrane having a thickness of $1.5\ \mu m$ to about 1 hour.

This apparatus can be used for the gaseous diffusion treatment while compressing the gas containing the impurity. In this case, the diffusion of the impurity into the wafer can be done under the formation of the silicon oxide membrane.

However, in the above-mentioned apparatus, the wafers and the heater for heating the wafers are disposed in the same chamber with the result that the compressed gas which is charged into the chamber contacts both the wafers and the heater. In this case, the semiconductor wafers are contaminated with various impurities vaporized from the heater through the compressed gas with the result that the electrical characteristics of the semiconductor device are disadvantageously deteriorated.

It is preferable to prepare the chamber with a material which does not vaporize an impurity for contaminating the wafers such as quartz so as to prevent the contamination caused by the material of the chamber. However, in the above-mentioned apparatus, the pressure difference between the outer pressure and the inner pressure of the chamber is too high. Accordingly, it is difficult to form the chamber of the apparatus with quartz which has a rather low mechanical strength under the pressure.

SUMMARY OF THE INVENTION

It is an object of the present invention to provide an improved apparatus for the treatment of a semiconductor wafer under a condition preventing contamination of the semiconductor wafer caused by a heater by using a compressed gas and the heater for heating the wafer.

It is another object of the invention to provide an improved apparatus for treatment of a semiconductor wafer under a low pressure difference between the outer pressure and the inner pressure of the chamber and a condition preventing contamination of the semiconductor wafer caused by a heater by using a compressed gas and the heater for heating the wafer.

The foregoing and other objects are attained in accordance with one aspect of the present invention through the provision of an apparatus for treatment of a semiconductor wafer which comprises a sealable treating vessel which forms a sealable treating chamber in a vessel by sealing the vessel. The apparatus further comprises a sealable outer vessel in which the treating vessel is disposed so as to form an auxiliary chamber closely separated from the treating chamber in the outer vessel when the outer vessel and the treating vessel are sealed.

BRIEF DESCRIPTION OF THE DRAWINGS

Various objects, features and attendant advantages of the present invention will be more fully appreciated as the same becomes better understood from the following detailed description of the present invention when considered in connection with the accompanying drawing, in which:

The FIGURE is a sectional view of one embodiment of the apparatus for treatment of a semiconductor wafer according to the invention.

DETAILED DESCRIPTION OF A PREFERRED EMBODIMENT

The apparatus for treatment of a semiconductor wafer shown in the FIGURE is suitable for heat oxidizing treatment of the semiconductor wafer.

The apparatus comprises an outer vessel 10 and an inner treating vessel 30 for treatment. The outer vessel 10 is a pressure durable vessel which comprises a body 12 and a cover 18 which is detachable from the body 12. The body 12 has a tubular part 14 and an end wall plate 16 which are made of a metal having high mechanical strength such as stainless steel or an Al-Ni-Co alloy referred to as Alnico (trade name) and have a thickness of $5 - 10$ mm.

The tubular part 12 of the embodiment is a cylindrical shell having an outer diameter of $300 - 500$ mm and a longitudinal length of about 1000 mm. The end wall plate 16 is formed in one piece with the tubular part 14 so as to close the right end of the tubular part 14. A flange 14A is formed at the left end of the tubular part 14.

A cover 18 is fixed to the flange 14A with a sealing gasket 20 therebetween by plural pairs of bolts and nuts 22. When the cover 18 is fixed to the flange 14A by the bolts and nuts 22, the outer vessel 10 is sealed. The cover 18 is made of the same material as the body 12.

The inner treating vessel 30 is disposed in the outer vessel 10 and has a body 32 and a cover 40 which is_ detachable from body 32. Both the body 32 and the cover 40 are made of quartz and have, for example, a thickness of 3 – 8 mm. The body 32 has a tubular part 34 and two coupling ducts 36, 38, is cylindrical, and is disposed in concentric position with respect to the tubular part 14 of the body 12 of the outer vessel 10.

The tubular part 34 has an outer diameter of 150 – 300 mm and a longitudinal length of 700 – 800 mm. The coupling duct 36 projects from the center of the right end of the tubular part 34 and the projected end is connected to the center of the end wall plate 16 of the body 12 of the outer vessel 10.

The coupling duct 38 projects from the upper part of the tubular part 34 at its left side and the projected end is connected to the tubular part 14 of the body 12 of the outer vessel 10. The coupling ducts 36, 38 support the inner treating vessel 30 in the outer vessel 10. It is preferable to provide other supporting means for supporting the inner treating vessel 30 in the outer vessel 10 together with the coupling ducts 36, 38.

A tapered part 34A has an inclined part which reduces the diameter at the left end of the tubular part 34. A cover 40 has a tapered part 40A which fits the tapered part 34A. The tapered part 40A is formed to seal the connection of the tapered part 34A and the tapered part 40A by fitting it to the tapered part 34A.

The cover 40 is connected to the center of the inner surface of the cover 18 of the outer vessel 10 through the spring 42. When the cover 18 is connected to the flange 14A, the tapered part 40A of the cover 40 is fitted to the tapered part 34A. The spring 42 presses the cover 40 against the tubular part 34 so as to precisely seal the tapered parts 40A, 34A.

When the outer vessel 10 is sealed by the cover 18, the inner treating vessel 30 is also sealed by the cover 40 whereby a treating chamber 30A and an auxiliary chamber 10A which are divided by the partition of the inner treating vessel 30 are formed in the outer vessel 10. The treating chamber 30A is formed in the inner treating vessel 30 and the auxiliary chamber 10A is formed from the inner treating vessel.

In the outer vessel 10, a heating device 50 is disposed together with the inner treating vessel 30. The heating device 50 is disposed in the auxiliary chamber 10A and comprises a tubular body 52 which surrounds most of the tubular part 34 of the inner treating vessel 30 and a heater 54 which is wound on the tubular body 52. The tubular part 52 is made of an electrical insulator having heat durability such as alumina refractory. The tubular part 52 is connected to the tubular part 34 of the inner treating vessel 30 with a spacer 56 made of a refractory insulator so as to maintain a gap of less than 10 mm between the tubular part 52 and the tubular part 34.

The heater 54 is an electric heater which is heated by current, for example, a Kanthal heater or a platinum heater. The heater 54 has a pair of terminals 54a, 54b which are led out and pass through a sealed element 58 disposed in tubular part 14 of the outer vessel 10.

The heating device 50 has plural temperature detecting elements 60 which are used for detecting the temperature of the heating device 50 and, for example, are thermocouples, and are disposed between the windings of the heater 54 wound on the outer surface of the tubular part 52. A pair of terminals 62 of the temperature detecting elements 60 are led out and pass through a sealed element 64 disposed in tubular part 14 of the outer vessel 10.

The first and second gas feeders 79, 80 are provided at the outer part of the outer vessel 10. The first gas feeder 70 is to feed a first compressed gas, i.e., a compressed oxidizing gas into the treating chamber 30A. The oxidizing gas is for example steam or oxygen gas. The gas feeder 70 is connected through the pipe 71 to the first pressure adjuster 72 which is connected to a pipe 73 which passes through the end wall plate 16 of the outer vessel 10. The pipe 73 is connected to the inner part of the coupling duct 36 of the inner treating vessel 30 whereby the compressed oxidizing gas fed from the pressure adjuster 72 is fed to the treating chamber 30A. The pressure $P_1$ of the oxidizing gas in the treating chamber 30A is adjusted to 5 – 13 atm., for example 10 atm., by the pressure adjuster 72.

The first gas discharge pipe 74 corresponding to the first gas feeder 70 is attached to the outer vessel 10. The first gas discharge pipe 74 is connected to the coupling duct 38 of the inner treating vessel and maintains the seal of the vessel 30 whereby the compressed oxidizing gas is discharged from the treating chamber 30A. The gas discharge pipe 74 is connected to a pressure adjusting valve 76 and a manometer 78.

The second gas feeder 80 is to feed the second compressed gas to the auxiliary chamber 10A. The gas feeder 80 is connected through a pipe 81 to the second pressure adjuster 82 which is connected to a pipe 83. The pipe 83 is connected to the auxiliary chamber 10A through the end wall plate 16 of the outer vessel 10 under a sealed condition whereby the second compressed gas fed from the pressure adjuster 82 is fed to the auxiliary chamber 10A.

The pressure $P_2$ of the second gas in the auxiliary chamber 10A is adjusted by the pressure adjuster 82 so as to be substantially the same as the pressure of the first gas in the treating chamber 30A. The pressure difference between $P_1$ and $P_2$ should be controlled to less than a predetermined pressure such as 0.5 atm., preferably 10 atm.

The stress to the inner treating vessel 30 made of quartz can be reduced by controlling the pressure difference to completely prevent rupture of the inner treating vessel 30. The sealing between the body of the inner treating vessel 30 and the cover 40 can be performed by the simple sealing structure of a taper fitting.

The first and second pressure adjusters 72, 82 can be of a design so as to able to independently adjust the pressures $P_1$ and $P_2$ to predetermined values. However it is preferable to use the pressure adjusters for controlling the pressures $P_1$ and $P_2$ to substantially the same pressure. It is especially preferable to use the pressure adjusters so that the pressure adjuster 72 detects $P_2$ and adjusts $P_1$ to be the same as $P_2$ and the pressure adjuster 82 detects $P_1$ and adjusts $P_2$ to be the same as $P_1$.

The second gas is selected from gases which do not cause deterioration of the inner surface of the outer vessel 10 and the heater 54. It is preferable to use an inert gas, e.g., nitrogen gas or argon gas as the second gas.

When the outer vessel 10 is made of stainless steel or Alnico and the heater 54 is a Kanthal heater, the inert gas can be used without difficulty as the second gas. When the heater is made of platinum, the platinum heater deteriorates in a reducing atmosphere. Accordingly, a mixture of the inert gas and a small amount of oxygen gas should be used as the second gas.

The second gas discharge pipe 84 and a safety valve corresponding to the second gas feeder 80 are attached to the outer vessel 10. The gas discharge pipe 84 is connected to the auxiliary chamber 10A by passing through the tubular part 14 of the outer vessel 10 in a sealed condition whereby the second compressed gas is discharged from the auxiliary chamber 10A.

The pressure adjusting valve 86 and the manometer 88 are connected to the gas discharge pipe 84. The safety valve 90 is a conventional safety valve which discharges the second gas by automatically opening when the pressure $P_2$ of the auxiliary chamber 10A increases above a predetermined value whereby damage to the apparatus is prevented.

Plural semiconductor wafers 100 are disposed with spaces between each other on a board 102 made of quartz and are disposed in the inner treating vessel 30 before fixing the cover 18. The semiconductor wafers 100 are, for example, silicon wafers.

When the inner treating vessel 30 having the above-mentioned size is used, it is possible to arrange 24 pieces of silicon wafers 100 having a diameter of 30 – 75 mm on the board 102 and to heat-oxidize them at the same time.

In the heat oxidizing treatment, the wafers 100 are heated at 900°–1100°C, especially about 1000° C, by the heating device 50 and are effectively heat-oxidized while feeding the compressed oxidizing gas. The time required for forming a silicon oxide membrane having a thickness of 1.5 $\mu$m is about 1 hour.

The temperature generated by the heating device 50 is detected by a temperature detecting element 60 and the power for the heater 54 is controlled so as to yield a consant detected temperature whereby the temperature of the wafers 100 can be maintained constant during the treatment. In the apparatus shown in FIG. 1, the heating device 50 is disposed in the auxiliary chamber 10A which is separated from the trating chamber 30A with the result that contamination of the wafer 100 caused by the heating device 50 can be completely prevented.

The apparatus shown in FIG. 1 can also be used for a gaseous diffusion treatment. In this case, a mixture of a carrier gas and an impurity gas is used as the first gas and is compressed and fed to the treating chamber 30A.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. Apparatus for the treatment of a semiconductor wafer comprising:
   an inner treating vessel,
   an outer vessel,
   the inner treating vessel being disposed within the outer vessel,
   a semiconductor wafer disposed within the inner treating vessel,
   a first gas feeder,
   a first pressure adjuster,
   a second gas feeder,
   a second pressure adjuster,
   means connecting the first gas feeder to the first pressure adjuster,
   means connecting the first pressure adjuster to the inner treating vessel,
   means connecting the second gas feeder to the second pressure adjuster,
   means connecting the second pressure adjuster to the outer vessel,
   the first pressure adjuster maintaining the pressure within the inner treating vessel substantially the same as the pressure in the outer vessel,
   the second pressure adjuster maintaining the pressure within the outer vessel substantially the same as the pressure in the inner treating vessel,
   a heater disposed within the outer vessel surrounding the inner treating vessel and having no portion thereof within the inner treating vessel to heat the first gas and to prevent the first gas from being contaminated by the heater.

* * * * *